United States Patent [19]

Onodera et al.

[11] Patent Number: 5,236,809
[45] Date of Patent: Aug. 17, 1993

[54] PHOTOPOLYMERIZABLE RESIN COMPOSITION EMPLOYING (METH)ACRYLONITRILE IN THE LINEAR COPOLYMER TO IMPART ADDITIONAL FLEXIBILITY OF THE COMPOSITION

[75] Inventors: Junichi Onodera, Samukawa; Shigeru Otawa, Yamato, both of Japan

[73] Assignee: Tokyo Ohka Kogyo Co., Ltd., Japan

[21] Appl. No.: 715,013

[22] Filed: Jun. 13, 1991

Related U.S. Application Data

[63] Continuation of Ser. No. 425,133, Oct. 23, 1989, abandoned.

[30] Foreign Application Priority Data

Oct. 24, 1988 [JP] Japan .................. 63-267662

[51] Int. Cl.$^5$ .................. G03F 7/025; G03F 7/027; G03F 7/031; G03F 7/033
[52] U.S. Cl. .................. 430/283; 430/281; 430/285; 430/288; 430/906; 430/910; 430/954
[58] Field of Search .................. 430/285, 283, 906, 910, 430/281, 954, 288

[56] References Cited

U.S. PATENT DOCUMENTS

| | | | |
|---|---|---|---|
| 4,123,276 | 10/1978 | Kita et al. | 430/176 |
| 4,239,849 | 12/1980 | Lipson et al. | 430/910 |
| 4,293,635 | 10/1981 | Flint et al. | 430/283 |
| 4,741,987 | 5/1988 | Tohda et al. | 430/288 |
| 4,806,450 | 2/1989 | Hofman et al. | 430/906 |
| 4,956,261 | 9/1990 | Pawlowski et al. | 430/175 |

FOREIGN PATENT DOCUMENTS 0337403  10/1989  European Pat. Off. ............ 430/285

OTHER PUBLICATIONS

Chemical Abstract, vol. 106, No. 41619j, "Photopolymerizable Compositions".
Chemical Abs vol. 109 No. 83462v "Benzotriazolecarboxylic acid additive for positive . . . ".
Chemical Abs vol. 94 No. 183442d "Developers for diazo-type presensitized lith. plates".
Chemical Abs. vol. 109 No. 240742f "Preparation of printing plates from photosens. lith. plates".
Chem. Abs. vol. 84 No. 172175m "Light-Sensitive Comp. for Printing Plates".
U.S. application - 07/332,917 "Photopolymerizable Composition".

Primary Examiner—Bowers, Jr. Charles L.
Assistant Examiner—John S. Chu
Attorney, Agent, or Firm—Lowe, Price, LeBlanc & Becker

[57] ABSTRACT

The present invention relates to a photopolymerizable resin composition developable with an aqueous weak alkaine solution and suitable for a printed circuit board.

The photopolymerizable resin composition of the present invention is mainly composed of:
  (a) a linear acrylic copolymer,
  (b) an ethylenically unsaturated compound, and
  (c) a photopolymerization initiator, wherein said linear acrylic copolymer comprises as indispensable comonomers:
  i) at least one compound represented by the general formula:

$$CH_2=\underset{X}{C}-CO-Y-Z-OH$$

wherein X is a hydrogen atom or a methyl group, Y is an oxygen atom or an imino group and Z is an alkylene group having 1 to 5 carbon atoms, and
  ii) an ethylenically unsaturated compound having a carboxyl group.

the photopolymerizable resin composition of the present invention can afford a resist film having excellent flexibility and adhesion through the use of the above-described particular linear acrylic copolymer. Therefore, when, for example, a printed circuit board is prepared by making use of the photopolymerizable resin composition of the present invention, occurrence of defectives can be remarkably reduced because no crack occurs on the resist film and no etchant penetrates into the gap formed between the resist film and the surface of the board.

1 Claim, No Drawings

PHOTOPOLYMERIZABLE RESIN COMPOSITION EMPLOYING (METH)ACRYLONITRILE IN THE LINEAR COPOLYMER TO IMPART ADDITIONAL FLEXIBILITY OF THE COMPOSITION

This application is a continuation of application Ser. No. 07/425,133, filed Oct. 23, 1989, now abandoned.

FIELD OF THE INVENTION

The present invention relates to a photopolymerizable resin composition, and more particularly to a photopolymerizable resin composition suitable for production of a printed circuit board developable with an aqueous weak alkaline solution.

BACKGROUND OF THE INVENTION

A printed circuit board is prepared by, e.g., either coating a copper surface of a copper-clad laminate or a surface of a flexible printed board with a solution of a photopolymerizable resin composition, or laminating on the surface of a copper substrate a photopolymerizable film formed by previously coating or pouring the composition into a film to form a resist film, selectively exposing the resist film to an actinic radiation to form a latent image, developing said image with a developer comprising an aqueous alkaline solution or the like to form a resist image on the copper substrate, and subjecting the copper surface not protected by the resist image to etching treatment or metal plating.

Particularly, in recent years, a laminate having a three-layer structure which is developable with an aqueous alkaline solution and flexible, i.e., a dry film resist comprising a support film layer, a photopolymerizable resin layer, and a protective film, has been strongly demanded in order to improve workability, the problem of air pollution, and yield.

In general, a resin composition comprising a carboxylated acrylic copolymer, a photopolymerizable monomer, and a photopolymerization initiator has been employed as the photopolymerizable resin composition developable with an aqueous alkaline solution.

OBJECT OF THE INVENTION

When the above-described photopolymerizable resin composition developable with an aqueous alkaline solution is used as a dry film resist for a flexible printed board, the flexibility is insufficient because the glass transition point of the photopolymerizable resin composition is high, which makes the resist film formed on the flexible printed board susceptible to cracking. This causes the occurrence of failure such as breaking of wire.

When the above-described dry film resist is used as an etching resist for etching a copper-clad laminate having a through-hole, problems occur such as penetration of an etchant into a gap formed between the resist film and the copper surface because of poor adhesion of the copper surface to the resist film provided so as to cover the through-hole, or there occurs cracking due to poor flexibility of the photopolymerizable resin composition, which causes the etchant to penetrate thereinto, so that the copper surface covered by the resist film is etched as well.

The present inventors have made extensive and intensive studies with a view to solving the above-described problems of the prior art and, as a result, have found that the use of a particular linear acrylic polymer as a binder component of the resist can afford a remarkable improvement in the flexibility of the resist film, which has led to the completion of the present invention.

SUMMARY OF THE INVENTION

In brief, the present invention relates to a photopolymerizable resin composition mainly composed of:
(a) a linear acrylic copolymer,
(b) an ethylenically unsaturated compound, and
(c) a photopolymerization initiator,
wherein said linear acrylic copolymer comprises as indispensable comonomers:
i) at least one compound represented by the following general formula:

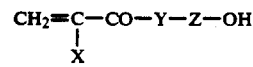

wherein X is a hydrogen atom or a methyl group, Y is an oxygen atom or an imino group and Z is an alkylene group having 1 to 5 carbon atoms, and
ii) an ethylenically unsaturated compound having a carboxyl group.

DETAILED DESCRIPTION OF THE INVENTION

Features of the present invention will now be described in detail.

At the outset, each of the above-described components will be described in detail.

COMPONENT (A)

Component (a) of the photopolymerizable resin composition according to the present invention is a linear acrylic copolymer prepared by copolymerizing the following two monomers (i) and (ii) as indispensable comonomers:
i) at least one compound represented by the following general formula:

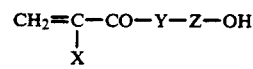

wherein X is a hydrogen atom or a methyl group, Y is an oxygen atom or an imino group and Z is an alkylene group having 1 to 5 carbon atoms, and
ii) an ethylenically unsaturated compound having a carboxyl group.

It is preferred that the above-described comonomer (i) be contained in an amount of 1 to 30% by weight based on the total amount of the comonomers. When the amount of comonomer (i) is below this range, the flexibility is insufficient, while when it is above this range, also a portion unexposed with an actinic radiation becomes insoluble in an aqueous alkaline solution unfavorably.

Specific examples of the above-described comonomer (i) include 2-hydroxyethyl acrylate, 2-hydroxyethyl methacrylate, 2-hydroxypropyl acrylate, 2-hydroxypropyl methacrylate, 3-hydroxybutyl acrylate, 3-hydroxybutyl methacrylate, 5-hydroxypentyl acrylate, 5-hydroxypentyl methacrylate, hydroxymethylacrylamide, hydroxymethylmethacrylamide, 2-hydroxyethylacrylamide, 2-hydroxyethylmethacrylamide, 2-hydroxypropylacrylamide, 2-hydroxypropylmethacrylamide, 3-hydroxybutylacrylamide, 3-hydroxybutylmethacrylamide, 5-hydroxypentylacrylamide, and 5-hydroxypentylmethacrylamide.

The above-described comonomer (ii) is an ethylenically unsaturated compound having a carboxyl group, and it is preferred that comonomer (ii) be contained in an amount of 10 to 25% by weight based on the total amount of the comonomers. When the amount of comonomer (ii) is below this range, it becomes difficult to conduct development with an aqueous alkaline solution, while when it is above this range, no sufficient flexibility can be obtained.

Specific examples of the above-described comonomer (ii) include acrylic acid, methacrylic acid,

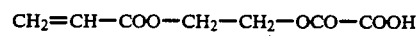

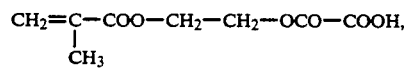

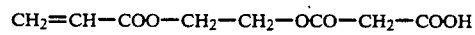

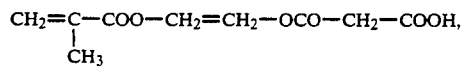

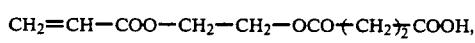

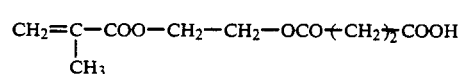

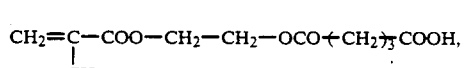

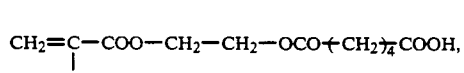

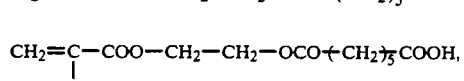

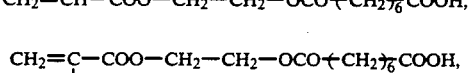

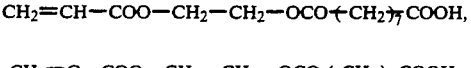

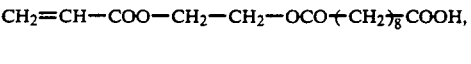

-continued

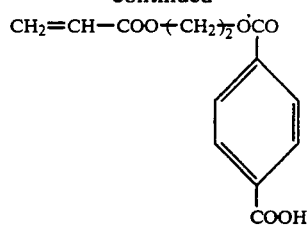

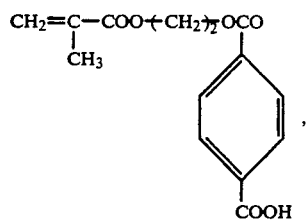

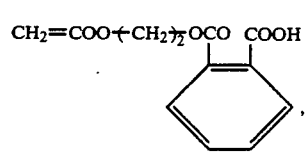

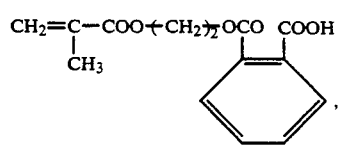

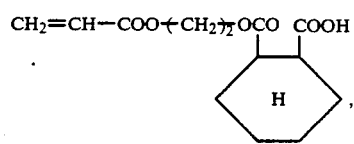

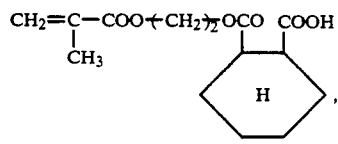

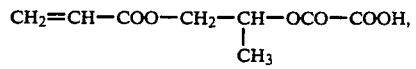

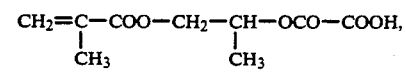

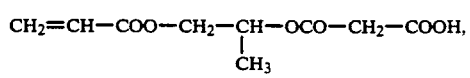

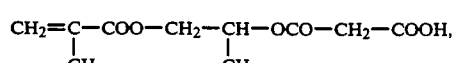

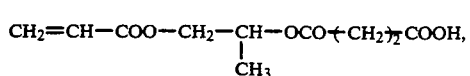

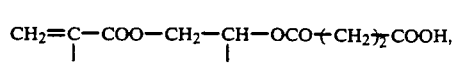

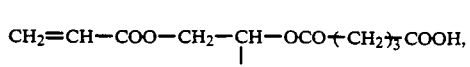

-continued

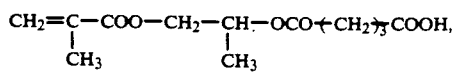
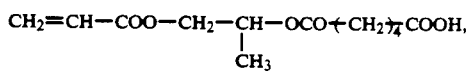
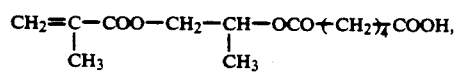
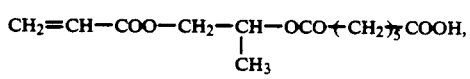
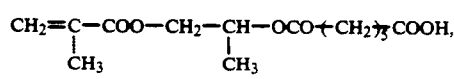
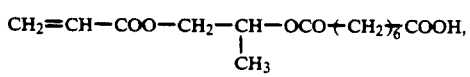
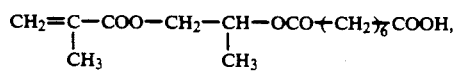
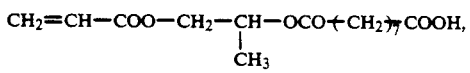
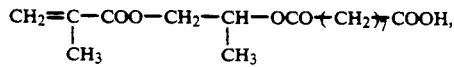
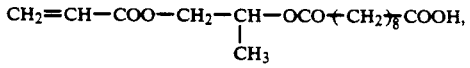
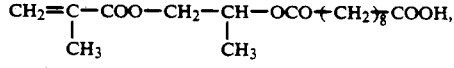
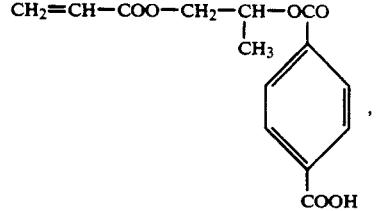
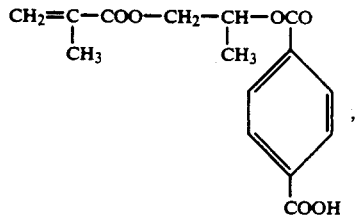
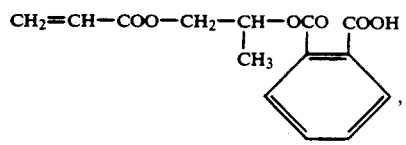

-continued

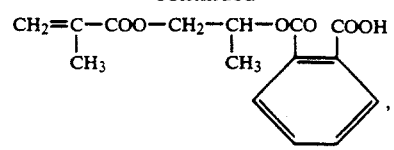
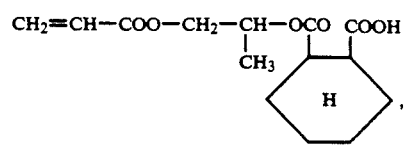

and

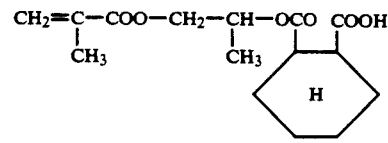

though not limited to these only.

In the present invention, it is possible to use at least one monomer copolymerizable with these comonomers (i) and (ii) when linear acrylic comonomer (a) is prepared by making use of at least one of each of comonomers (i) and (ii).

Examples of the above-described other suitable copolymerizable monomer include methyl acrylate, methyl methacrylate, ethyl acrylate, ethyl methacrylate, butyl acrylate, butyl methacrylate, glycidyl acrylate, glycidyl methacrylate, tert-butylaminoethyl acrylate, tert-butylaminoethyl methacrylate, 2, 3-dibromopropyl acrylate, 2, 3-dibromopropyl methacrylate, 3-chloro-2-hydroxypropyl acrylate, 3-chloro-2-hydroxypropyl methacrylate, tetrahydrofurfuryl acrylate, tetrahydrofurfuryl methacrylate, tribromophenyl acrylate, tribromophenyl methacrylate, acrylamide, methacrylamide, acrylonitrile, methacrylonitrile, styrene, α-methylstyrene, vinyltoluene, and butadiene.

The above-described other copolymerizable monomer is used in an amount of 45 to 89% by weight based on the total amount of the comonomers. In particular, the use of acrylonitrile or methacrylonitrile as the above-described copolymerizable monomer in an amount of 10 to 30% by weight based on the total amount of the comonomers favorably improves not only the resistance of the resist film to the etchant or plating solution but also adhesion and flexibility.

It is preferred that component (a) of the present invention have a weight-average molecular weight of 30,000 to 200,000, a grass transition point of 20° to 80° C., and an acid value of 50 to 150. When the weight-average molecular weight is below this range, the strength of the resist pattern becomes insufficient, while when it is above this range, the adhesion to the board becomes poor. When the glass transition point is below this range and a laminate having a three-layer structure is formed therefrom, the photopolymerizable resin layer often leaches at room temperature from the laminate, which makes it impossible to use the laminate as the dry film resist. On the other hand, when the glass transition point is above this, it is impossible to fill up an uneven portion when the composition is laminated on a substrate having an uneven surface.

COMPONENT (B)

Component (b) of the photopolymerizable resin composition according to the present invention is an ethylenically unsaturated compound which forms a polymer through the action of a photopolymerization initiator, and examples of such a compound include esters of acrylic acid, esters of methacrylic acid, acrylamides, methacrylamides, allyl compounds, vinyl ether compounds, and vinyl ester compounds.

Examples of the alcohol constituting the ester of acrylic or methacrylic acid include propyl alcohol, ethylene glycol, polyethylene glycol, propylene glycol, polypropylene glycol, neopentyl glycol, trimethylolpropane, pentaerythritol, butanediol, and trimethylolethane.

Examples of the acrylamides and methacrylamides include, besides methylenebisacrylamide and methylenebismethacrylamide, an amide of a polyamine, such as ethylenediamine or hexamethylenediamine, with acrylic or methacrylic acid.

Examples of the allyl compound include diallyl esters of phthalic acid, adipic acid, malonic acid, etc.

The vinyl ether compound is a polyvinyl ether of a polyhydric alcohol, and examples of the polyhydric alcohol include ethylene glycol, polyethylene glycol, propylene glycol, polypropylene glycol, neopentyl glycol, trimethylolpropane, pentaerythritol, butanediol, and trimethylolethane.

Examples of the vinyl ester compound include divinyl succinate, divinyl adipate, and divinyl phthalate.

The content of the above-described component (b) in the photopolymerizable resin composition of the present invention is preferably 10 to 100 parts by weight based on 100 parts by weight of the above-described component (a).

COMPONENT (C)

Component (c) of the photopolymerizable resin composition according to the present invention is a photopolymerization initiator which initiates polymerization of the above-described ethylenically unsaturated compound, i.e., component (b), upon being exposed to an actinic radiation. Examples of component (c) include anthraquinone, its derivatives such as 2-methylanthraquinone and 2-ethylanthraquinone, benzoin, its derivatives such as benzoin methyl ether, benzophenone, phenanthrenequinone, and 4,4'-bis-(dimethylamino)benzophenone.

These photopolymerization initiator components (c) may be used alone or in any combination of two or more of them.

The content of the above-described component (c) in the photopolymerizable composition of the present invention is preferably 1 to 15 parts by weight based on 100 parts by weight of the above-described component (a).

AUXILIARY COMPONENT

The photopolymerizable resin composition of the present invention may contain, besides the above-described components, auxiliary components such as heat polymerization inhibitor, dyes, pigments, coating aids, flame retardants and flame retardant aids. Criterion for selection of these auxiliary components is the same as that in the case of the conventional photopolymerizable composition.

In the present invention, in particular, incorporation of benzotriazolecarboxylic acid, such as carboxybenzotriazole, in an amount of 0.005 to 3 parts by weight based on 100 parts by weight of the above-described component (a) favorably contributes to a further improvement in the adhesion.

METHOD OF USE

The photopolymerizable resin composition of the present invention is used by dissolving each of the components in a suitable solvent followed by mixing together.

Representative examples of the suitable solvent include methyl ethyl ketone, ethyl acetate, toluene, methylene chloride, and trichloroethane, though it is not limited to these only.

When the photopolymerizable resin composition of the present invention is used, either a solution prepared by dissolving the components in the above-described solvent is directly applied to a substrate, e.g., a copper-clad laminate and dried to form a resist film, or the above-described solution is applied on, e.g., a polyester film as a support film and dried to form a resist film, and the resist film is heat-laminated on a copper-clad laminate. In this case, the thickness of the resist film is preferably 25 to 50 μm. Then, an actinic radiation is selectively applied to the resist film and development is conducted to form a resist image on the substrate. Copper surface portions not protected by the resist image are subjected to etching treatment or metal plating to prepare a printed circuit board.

DEVELOPER

The developer used for development after selective exposure of a resist film prepared from the photopolymerizable resin composition of the present invention is an aqueous weakly alkaline solution.

Examples of a base used for preparation of the weakly alkaline solution include alkaline hydroxides, i.e., hydroxides of lithium, sodium or potassium; alkaline carbonates, i.e., carbonate and bicarbonate of lithium, sodium or potassium; alkaline metal phosphates such as sodium phosphate and potassium phosphate; alkaline metal pyrophosphates such as sodium pyrophosphate and potassium pyrophosphate; primary amines such as benzylamine and butylamine; secondary amines such as dimethylamine; benzylmethylamine, and diethanolamine; tertiary amines such as trimethylamine, triethylamine, and triethanolamine; cyclic amines such as morpholine, piperazine, piperidine, and pyridine; polyamines such as ethylenediamine and hexamethylenediamine; ammonium hydroxides such as tetramethylammonium hydroxide, tetraethylammonium hydroxide, trimethylbenzylammonium hydroxide, and trimethylphenylammonium hydroxide; and sulfonium hydroxides such as trimethylsulfonium hydroxide, diethylmethylsulfornium hydroxide, and dimethylbenzylsulfonium hydroxide.

EMBODIMENTS OF THE INVENTION

The present invention will now be described in more detail by way of Examples which, however, should not be construed as limiting the scope of the present invention. Examples 1 and 2 and Comparative Examples 1 and 2.

Photopolymerizable resin composition solutions were prepared by making use of linear acrylic copolymers listed in the following Table 1 according to the following recipe.

TABLE 1

| Linear acrylic copolymer | |
|---|---|
| Ex. 1 | methyl methacrylate/methacrylic acid/2-hydroxypropyl methacrylate/acrylonitrile/ethyl methacrylate (weight ratio: 20/20/20/20/20) copolymer (average molecular weight: about 50,000) |
| Ex. 2 | ethyl acrylate/methacrylic acid/2-hydroxyethyl methacrylate/acrylonitrile/ethyl methacrylate (weight ratio: 20/20/10/20/30) copolymer (average molecular weight: about 50,000) |
| Comp. Ex. 1 | methyl methacrylate/methacrylic acid/acrylonitrile/ethyl methacrylate (weight ratio: 40/20/20/20) copolymer (average molecular weight: about 50,000) |
| Comp. Ex. 2 | methyl methacrylate/methacrylic acid/acrylonitrile/ethyl methacrylate (weight ratio: 30/30/20/20) copolymer (average molecular weight. about 50,000) |

| Recipe linear acrylic copolymer | |
|---|---|
| (see Table 1) | 100 parts by weight |
| trimethylolpropane triacrylate | 15 parts by weight |
| tetraethylene glycol diacrylate | 20 parts by weight |
| benzophenone | 5 parts by weight |
| 4,4'-bis(dimethylamino)-benzophenone | 0.6 parts by weight |
| crystal violet | 0.1 part by weight |
| carboxybenzotriazole | 0.1 part by weight |
| methyl ethyl ketone | 300 parts by weight |

Each of the photopolymerizable resin composition solutions prepared above was uniformly applied to a 25 μm-thick polyethylene terephthalate film and dried to form a 30 μm-thick resist film. The formed film having a resist coating was laminated on a flexible substrate comprising a 0.2 mm-thick polymide film and a 35 μm-thick copper layer formed thereon in such a manner that said copper layer faces said resist coating. An actinic radiation of 90 mJ/cm² was applied from the side of the polyethylene terephthalate film through a negative film by means of a 3 kW ultrahigh pressure mercury lamp (Model HMW-201B; mfd. by ORC), and the polyethylene terephthalate film on the resist film was then removed. Thereafter, development was conducted by making use of a 1.5% aqueous sodium carbonate solution at 32° C. for 80 second with a spray developing machine, followed by washing with water and drying.

The flexible substrate having a resist pattern formed thereon was bent for about 1 second around a metal rod having a diameter of 10, 20, 30 or 40 in. so as to have a U-shape to observe the state of occurrence of cracking on the surface of the resist pattern. The results are shown in Table 2.

TABLE 2

| | 40 in. | 30 in. | 20 in. | 10 in. |
|---|---|---|---|---|
| Ex. 1 | A | A | A | C |
| Ex. 2 | A | A | A | C |
| Comp. Ex. 1 | B | C | C | C |
| Comp. Ex. 2 | A | B | C | C |

TABLE 2-continued

| | 40 in. | 30 in. | 20 in. | 10 in. |
|---|---|---|---|---|
| Ex. 2 | | | | |

Note: The criteria for evaluation are as follows:
A: occurrence of no crack
B: occurrence of crack in a very limited portion of the surface of the resist pattern
C: occurrence of crack all over the surface of the resist pattern

ADVANTAGE OF THE INVENTION

The photopolymerizable resin composition of the present invention wherein a particular linear acrylic copolymer is used can afford a resist film having excellent flexibility and adhesion. Therefore when, for example, a printed circuit board is prepared by making use of the photopolymerizable resin composition of the present invention, occurrence of defectives can be remarkably lowered because no crack occurs on the resist film and no etchant penetrates into the gap formed between the resist film and the surface of the board.

What is claimed is:
1. A photopolymerizable resin composition, consisting essentially of
   (a) a linear acrylic copolymer having a weight-average molecular weight of 30,000 to 200,000 and a glass transition point of 20° to 80° C., consisting of as comonomers;
      (i) 1 to 30 percent by weight of at least one compound represented by the following general formula $CH_2=C(X)-CO-Y-Z-OH$ wherein X is a hydrogen atom of a methyl group, Y is an oxygen atom or an imino group and Z is an alkylene group having 1 to 5 carbon atoms,
      (ii) 10 to 25% by weight of an ethylenically unsaturated compound having a carboxyl group,
      (iii) at least one member selected from the group consisting of acrylonitrile and methacrylonitrile in an amount of 10 to 30% by weight based on the total amount of the comonomers,
      (iv) the remainder of the copolymer selected from the group consisting of methyl acrylate, methyl methacrylate, ethyl acrylate, ethyl methacrylate, butyl acrylate, butyl methacrylate, glycidyl acrylate, glycidyl methacrylate, tert-butylaminoethyl acrylate, tert-butylaminoethyl methacrylate, 2, 3-dibromopropyl acrylate, 2, 3-dibromopropyl methacrylate, 3-chloro-2-hydroxypropyl acrylate, 3-chloro-2-hydroxypropyl methacrylate, tetrahydrofurfuryl acrylate, tetrahydrofurfuryl methacrylate, tribromophenyl acrylate, tribromophenyl methacrylate, acrylamide, methacrylamide, styrene, α-methylstyrene, vinyltoluene, and butadiene;
   (b) an ethylenically unsaturated compound which forms a polymer through the action of a photopolymerization initiator selected from the group consisting of esters of acrylic acid, esters of methacrylic acid, acrylamides, methacrylamides, allyl compounds, vinyl ether compounds, and vinyl ester compounds,
   (c) a photopolymerization initiator, and
   (d) a benzotriazolecarboxylic acid wherein said ethylenically unsaturated compound, said photopolymerization initiator and said benzotriazole carboxylic acid are used in respective amounts of 10 to 100 parts by weight, 1 to 15 parts by weight, and 0.005 to 3 parts by weight based on 100 parts by weight of the linear acrylic copolymer.

* * * * *